United States Patent
Su

(10) Patent No.: US 11,528,818 B2
(45) Date of Patent: Dec. 13, 2022

(54) MOUNTING MECHANISM AND ELECTRONIC DEVICE HAVING THE SAME

(71) Applicant: Nanning FuLian FuGui Precision Industrial Co., Ltd., Nanning (CN)

(72) Inventor: Feng-Ching Su, New Taipei (TW)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 170 days.

(21) Appl. No.: 17/141,439

(22) Filed: Jan. 5, 2021

(65) Prior Publication Data

US 2021/0127510 A1 Apr. 29, 2021

Related U.S. Application Data

(62) Division of application No. 16/208,066, filed on Dec. 3, 2018, now abandoned.

(51) Int. Cl.
*H05K 5/02* (2006.01)
*H05K 5/00* (2006.01)
*G08B 13/22* (2006.01)

(52) U.S. Cl.
CPC ......... *H05K 5/0204* (2013.01); *H05K 5/0004* (2013.01); *G08B 13/22* (2013.01)

(58) Field of Classification Search
CPC .... F16M 13/022; F16M 13/02; H05K 5/0204; H05K 5/0004
See application file for complete search history.

(56) References Cited

U.S. PATENT DOCUMENTS

| | | | | |
|---|---|---|---|---|
| 5,587,889 A * | 12/1996 | Sacherman | .......... | G11B 33/124 |
| 9,088,138 B2 * | 7/2015 | Yu | .......... | H02B 1/0523 |
| 9,955,598 B1 * | 4/2018 | Wen | .......... | H05K 7/1428 |
| 2006/0285306 A1 * | 12/2006 | Carnevali | .......... | B60R 11/0252 |
| | | | | 361/758 |
| 2009/0051175 A1 * | 2/2009 | Pirillis | .......... | H05K 5/0204 |
| | | | | 292/281 |
| 2011/0253856 A1 * | 10/2011 | Short | .......... | F16M 13/02 |
| | | | | 248/222.14 |
| 2013/0043369 A1 * | 2/2013 | Wheeler | .......... | F16M 13/022 |
| | | | | 248/551 |

(Continued)

FOREIGN PATENT DOCUMENTS

| CN | 201318541 Y | 9/2009 |
|---|---|---|
| CN | 101770676 A | 7/2010 |

(Continued)

*Primary Examiner* — Rockshana D Chowdhury
*Assistant Examiner* — Douglas R Burtner
(74) *Attorney, Agent, or Firm* — ScienBiziP, P.C.

(57) ABSTRACT

A mechanism for mounting an electronic device to a ceiling or a wall includes a fixing seat with a mounting hole, a trigger button in the mounting hole, two clamping members slidably connected to the fixing seat, and two first elastic members. The clamping members abut opposing ends of the first positioning portion when the trigger button is at a first position, and the clamping members move toward each other by a resilient force when the trigger button moves toward the second position. In a second position two ends of the fixing member are clamped, thereby the electronic device is mounted firmly and stably to the fixing member. An electronic device having the mounting mechanism is also disclosed.

8 Claims, 6 Drawing Sheets

(56) References Cited

U.S. PATENT DOCUMENTS

| | | | | |
|---|---|---|---|---|
| 2013/0277520 A1* | 10/2013 | Funk | ...................... | F16M 13/02 |
| | | | | 248/274.1 |
| 2013/0301216 A1* | 11/2013 | Trinh | .................... | A47F 7/0246 |
| | | | | 361/679.58 |
| 2014/0008095 A1* | 1/2014 | Lalancette | ........... | H05K 5/0204 |
| | | | | 174/50 |
| 2015/0050077 A1* | 2/2015 | Huang | ................. | F16M 11/105 |
| | | | | 403/327 |
| 2015/0305518 A1* | 10/2015 | Galant | ................. | A47F 7/0246 |
| | | | | 29/525.08 |
| 2016/0318455 A1* | 11/2016 | Zhang | ................. | F16M 11/105 |
| 2017/0314732 A1* | 11/2017 | Minn | ................... | F16M 13/022 |
| 2017/0343028 A1* | 11/2017 | Chen | .................... | F16M 11/041 |
| 2017/0350555 A1* | 12/2017 | Jertson | ............... | A63B 69/3632 |
| 2018/0064249 A1* | 3/2018 | Diekroger | .............. | F16M 11/42 |
| 2018/0066428 A1* | 3/2018 | Diekroger | ............ | F16M 11/046 |
| 2018/0132364 A1* | 5/2018 | Apter | ........................ | F16B 2/12 |

FOREIGN PATENT DOCUMENTS

| | | |
|---|---|---|
| CN | 204201414 U | 3/2015 |
| CN | 205592577 U | 9/2016 |
| CN | 206058429 U | 3/2017 |
| CN | 108799709 A | 11/2018 |

* cited by examiner

MOUNTING MECHANISM AND ELECTRONIC DEVICE HAVING THE SAME

FIELD

The disclosure generally relates to a mounting mechanism.

BACKGROUND

Wireless electronic devices and monitors for indoor use are usually placed on tables, or installed on walls or ceilings. When mounting the electronic device to the ceiling, a mounting bracket is mounted to an aluminum bar of the ceiling, and then the electronic device is mounted to the mounting bracket.

BRIEF DESCRIPTION OF THE DRAWINGS

Many aspects of the present disclosure can be better understood with reference to the drawings. The components in the drawings are not necessarily drawn to scale, the emphasis instead being placed upon clearly illustrating the principles of the disclosure. Moreover, in the drawings, like reference numerals designate corresponding parts throughout the views.

DETAILED DESCRIPTION

Figure 1:
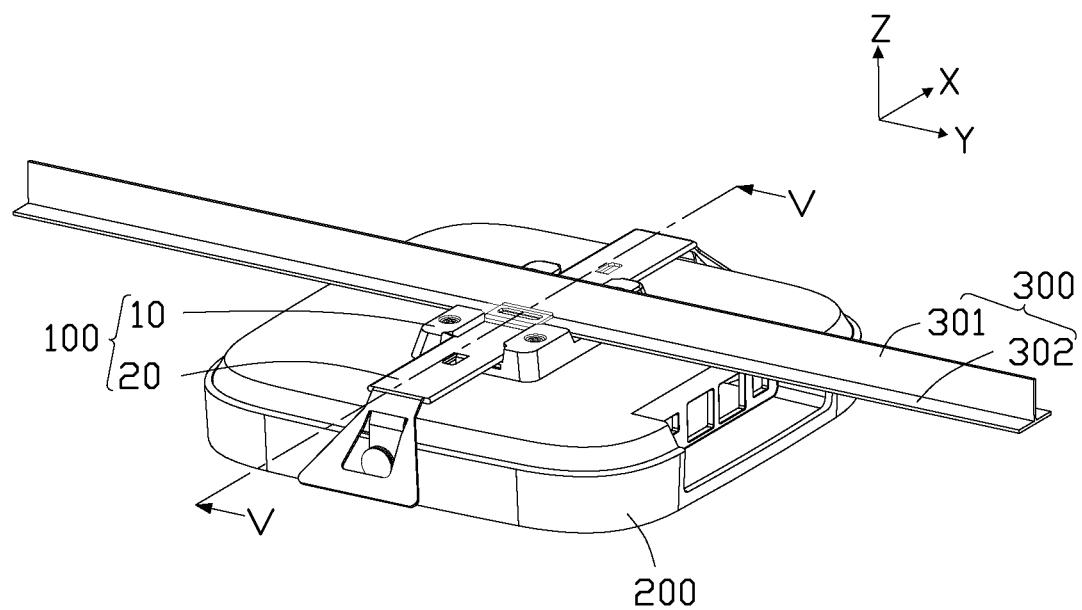
FIG. 1 is an isometric view of an embodiment of a mounting mechanism and an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

FIG. 1 shows an embodiment of a mounting mechanism 100 according to the present disclosure. The mounting mechanism 100 may be used for an electronic device 200, to mount the electronic device 200 to a fixing member 300. The fixing member 300 may include a first fixing member 301 and a second fixing member 302 vertically connected to the first fixing member 301. In at least one embodiment, the fixing member 300 may be an aluminum bar of a ceiling. In other embodiments, the fixing member 300 may be a bracket arranged on a desk or a wall.

The mounting mechanism 100 includes a fixing seat 10 and two clamping members 20. Each of the two clamping members 20 is slidably connected to each side of the fixing seat 10 and configured to mount the electronic device 200 to the fixing member 300.

Figure 2:
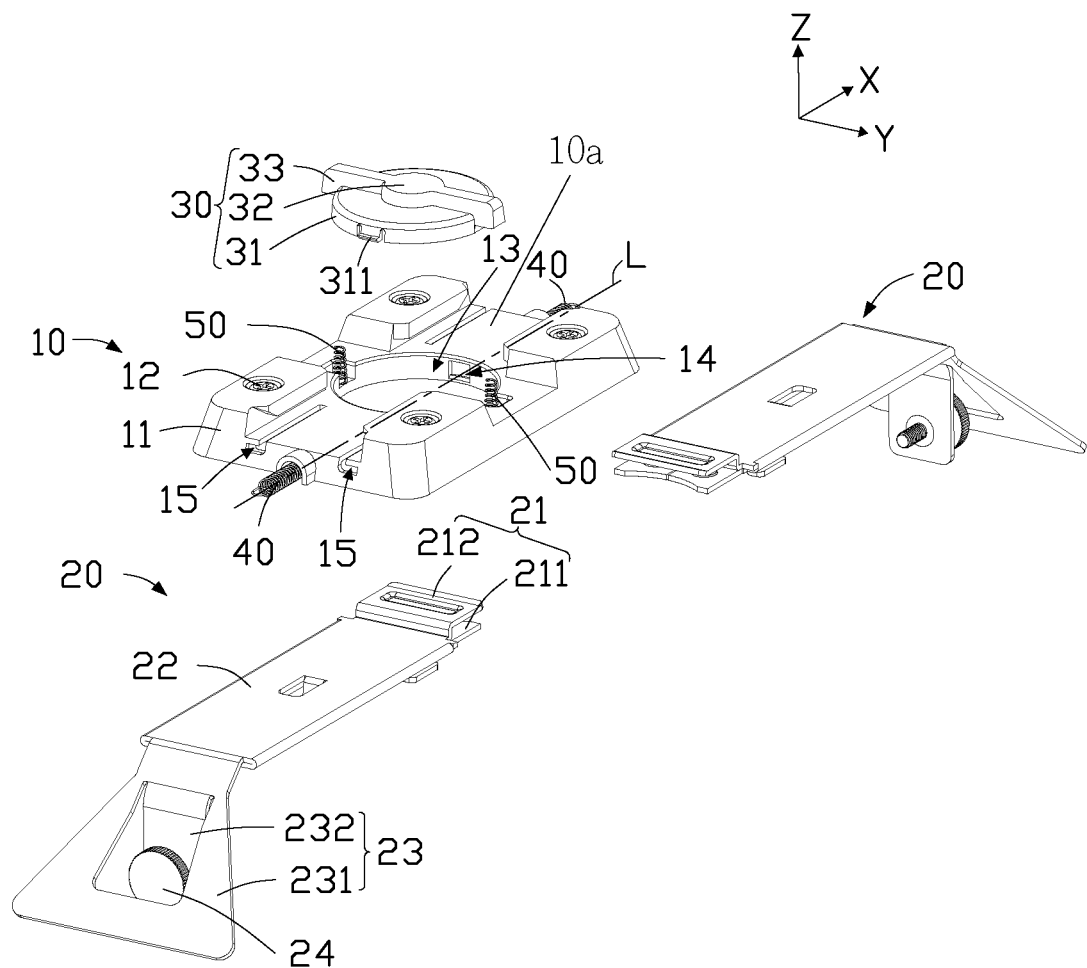
FIG. 2 is an exploded isometric view of the mounting mechanism of FIG. 1.

FIG. 2 shows that the fixing seat 10 can be rectangular shaped, a long axis of L is parallel to two long sides of the fixing seat 10, and the long axis of the L is arranged at equal distance with the two long sides. The fixing seat 10 can include a fixing base 10a and projections 11 disposed on the fixing base 10a, and each of the projections 11 is equipped with a first fastening member 12. The first fastening member 12 is used to fixedly connect the fixing seat 10 to the electronic device 200.

The fixing base 10a has a circular mounting hole 13, and an inner wall of mounting hole 13 defines two sliding holes 14 opposite to each other. The sliding holes 14 may be rectangular, and the two sliding holes 14 may be arranged along the long axis of the L. The sliding hole 14 extends in a height direction of the fixing seat 10 (direction Z).

The fixing seat 10 further defines a pair of parallel sliding slots 15 on two sides of the mounting hole 13. In at least one embodiment, each of the sliding slots 15 is linear and extends from an edge of the fixing seat 10 towards the mounting hole 13, that is, each of the sliding slots 15 extends along a direction parallel to the long axis of the L. The sliding slot 15 is offset by the long axis of the L.

Two clamping members 20 are slidably connected to two sides of the fixing seat 10. Each of the clamping members 20 includes a clamping part 21, a sliding part 22, and a holding part 23. The sliding part 22 is connected between the clamping part 21 and the holding part 23, and the sliding part 22 is arranged between two projections 11. The sliding part 22 is connected to the sliding slot 15 and adapted for sliding along the sliding slot 15 on the fixing seat 10 in a direction parallel to the long axis of the L.

The clamping part 21 may be arranged at one end of the clamping member 20 and include a first clamping piece 211 and a second clamping piece 212. The first clamping piece 211 may be slidably arranged on the fixing seat 10, and the second clamping piece 212 may be arranged at one side of the first clamping piece 211 away from the fixing seat 10. The first clamping piece 211 and the second clamping piece 212 may be parallel but distanced from each other. The holding part 23 may include a hand lifting portion 231 and a connecting portion 232. The hand lifting portion 231 can be arranged so as to incline to the sliding part 22. One end of the connecting portion 232 is connected to the hand holding portion 231, and other end of the connecting portion 232 is a free end. The connecting portion 232 may be located away farther from the fixing seat 10 than the sliding part 22 and perpendicular to the sliding part 22. The mounting mechanism 100 further comprises a second fastening member 24 screwed into the connecting portion 232 and the electronic device 200 to connect the mounting mechanism 100 to the electronic device 200. The mounting mechanism 100 is thereby stably connected with the electronic device 200.

Preferably, the clamping member 20 is metallic and integrally formed.

The mounting mechanism 100 may further include a trigger button 30, two first elastic members 40, and two second elastic members 50.

The trigger button 30 is movably housed in the mounting hole 13 of the fixing seat 10. The trigger button 30 may be circular and includes a first positioning portion 31, a second positioning portion 32, and two extending portions 33. Each of the second positioning portion 32 and each of the two extending portions 33 protrude out of the first positioning portion 31.

The first positioning portion 31 is slidably mounted in the mounting hole 13 of fixing seat 10. In this embodiment, the first positioning portion 31 may be circular, and the first positioning portion 31 may include two sliding protrusions 311, and the two sliding protrusions 311 may be arranged at opposing sides of the first positioning portion 31. Each of the sliding protrusions 311 may be slidably connected to one sliding hole 14. A height of the sliding protrusion 311 may be less than a height of the sliding hole 14, thereby the sliding hole 14 can provide a sliding stroke of the sliding protrusion 311. Therefore, the trigger button 30 can slide in the mounting hole 13 along a height direction (Z direction) of the fixing seat 10, and the trigger button 30 can slide between a first position and a second position of the mounting hole 13. In this embodiment, the first position is the end of the mounting hole 13 adjacent to the projections 11, and the second position is the end of the mounting hole 13 away from the projections 11.

The second positioning portion 32 may be circular. The first positioning portion 31 and the second positioning portion 32 may be concentric, and a radius of the second positioning portion 32 is less than a radius of the first positioning portion 31. The two extending portions 33 may be strip-shaped and extend from two ends of the second positioning portion 32 to the outsides of the first positioning portion 31. An extending direction of the extending portion 33 may be perpendicular to an extending direction of the two clamping members 20, that is, the extending portion 33 extends along a direction (Y direction) perpendicular to the long axis of the L.

Preferably, an end of the first clamping piece 211 is circular, enabling the first clamping piece 211 to abut against the first positioning portion 31 or against the second positioning portion 32 of the trigger button 30. A length of the second clamping piece 212 may be greater than a length of the first clamping piece 211, and a length difference between the first clamping piece 211 and the second clamping piece 212 may be smaller than a radius of the second positioning portion 32.

Each of the first elastic members 40 is positioned to correspond to one of the clamping members 20, and each of the first elastic members 40 may be connected between the clamping member 20 and the fixing seat 10. Each of the second elastic members 50 is connected between the trigger button 30 and the fixing portion 10. The two second elastic members 50 are opposite to each other. The first elastic member 40 provides a resilient force in a direction that is perpendicular to a direction in which the second elastic member 50 provides another resilient force.

Figure 3:
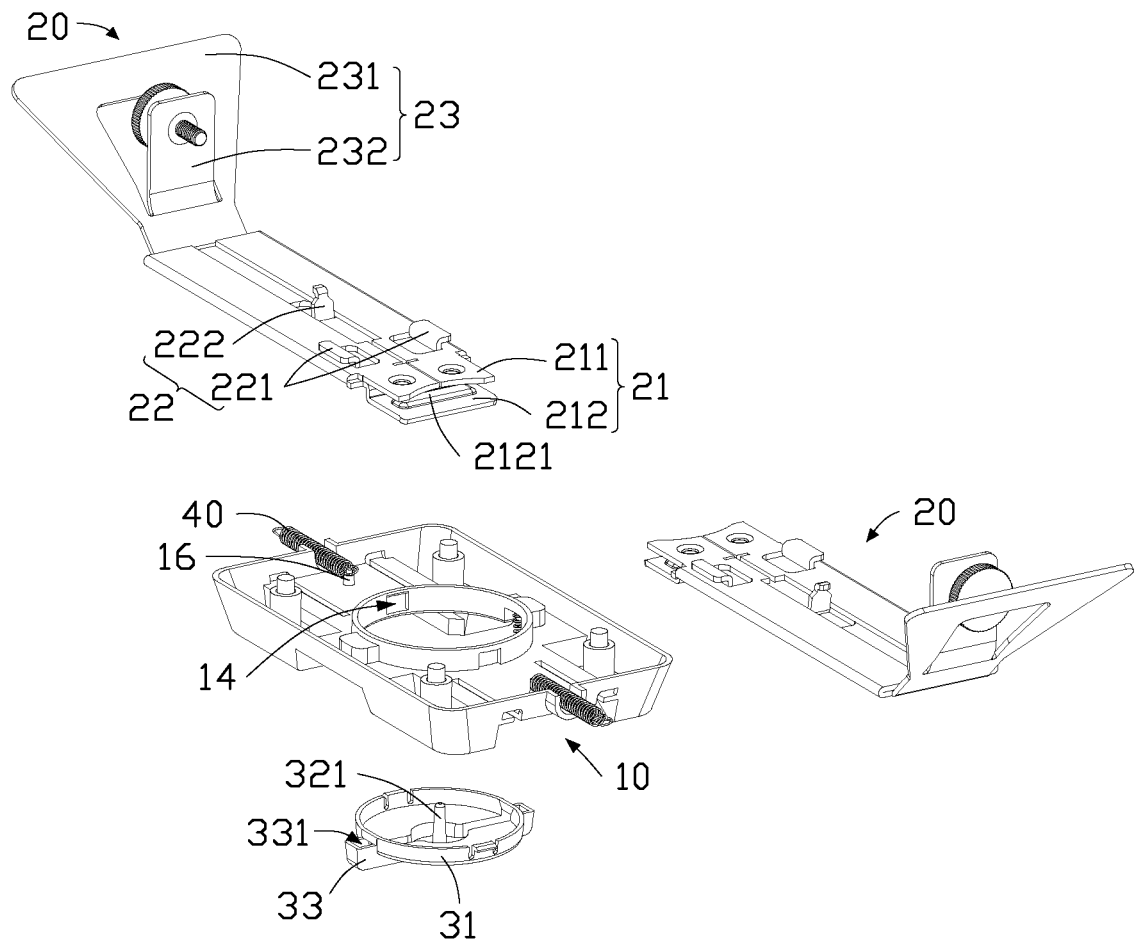
FIG. 3 is similar to FIG. 2, but viewed from another angle.

FIG. 3 shows one side of the fixing seat 10 away from the projections 11 includes two first fixing columns 16. The sliding part 22 of the clamping member 20 includes two guiding members 221 and a second fixing column 222 on one side towards the fixing seat 10. Each of the guiding members 221 is slidably coupled to the sliding slot 15 of the fixing seat 10, thereby the clamping members 20 can slide when connected with the fixing seat 10. The second fixing column 222 is in the middle of the sliding part 22. One end of each first elastic member 40 is fixed on the first fixing column 16 on the fixing seat 10, other end of each first elastic member 40 is fixed on the second fixing column 222 of the clamping member 20. The first elastic member 40 provides a resilient force to the clamping member 20.

The second positioning portion 32 of the trigger button 30 may further include a trigger bar 321 on one side toward the fixing seat 10. Each end of the two extending portions 33 defines a receiving groove 331 on the side toward the fixing seat 10, and each of the second elastic members 50 is positioned in the receiving groove 331. The second elastic members 50 provide resilient force to the trigger button 30.

Figure 4:
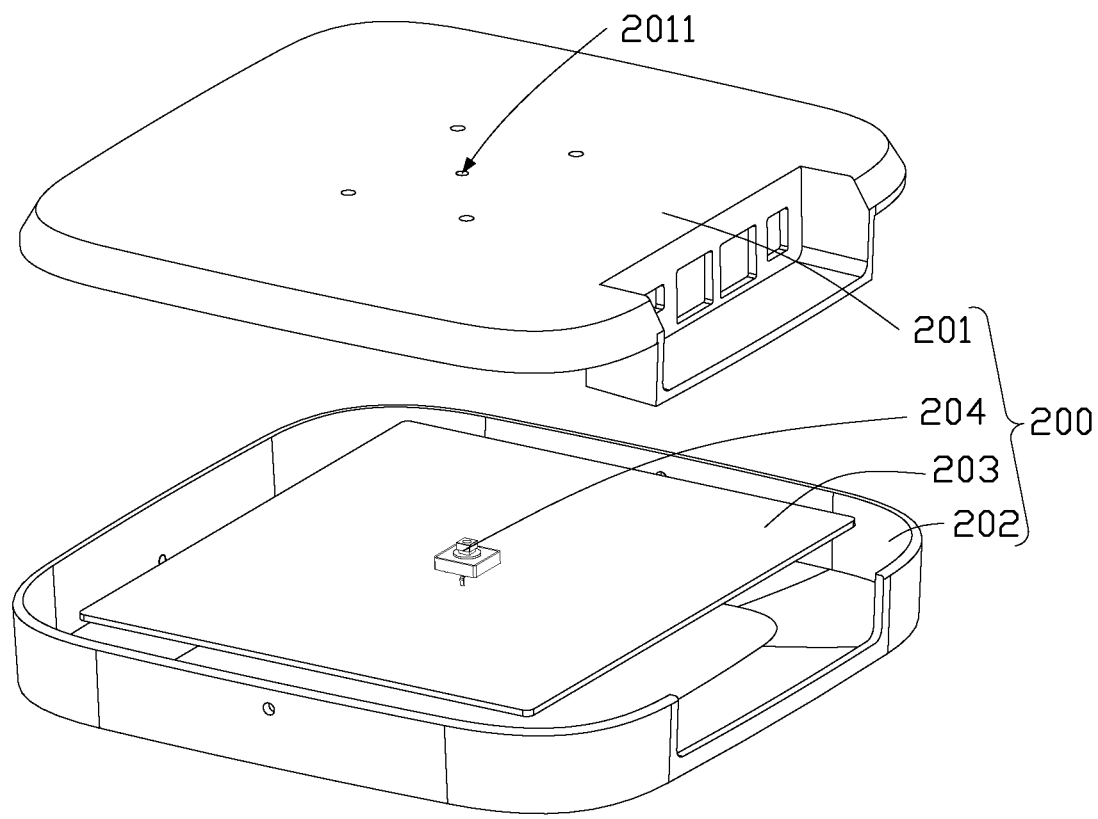
FIG. 4 is an exploded isometric view of the electronic device of FIG. 1.

FIG. 4 shows that the electronic device 200 may include a first housing 201, a second housing 202 connected to the first housing 201, and a circuit board 203 received in the space formed by the first housing 201 and the second housing 202. The circuit board 203 includes an inductive switch 204. The first housing 201 may include a through hole 2011 corresponding to the inductive switch 204.

Figure 5:
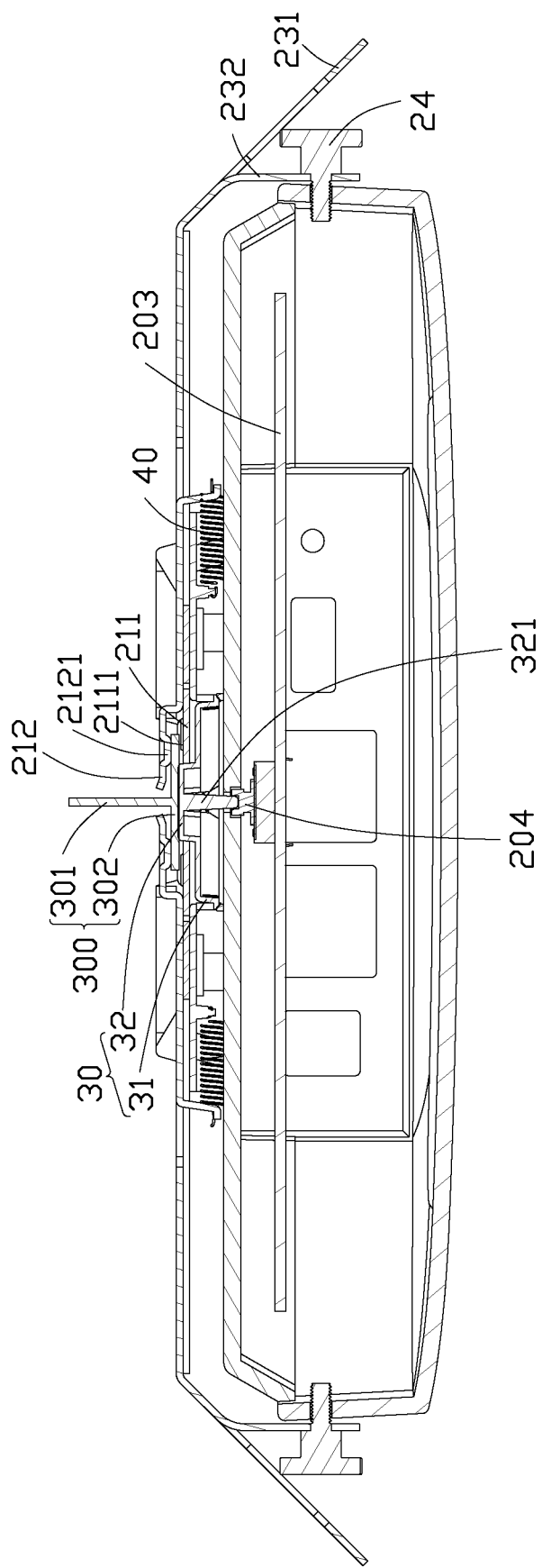
FIG. 5 is a cross-sectional view of the mounting mechanism and the electronic device taken along line V-V of FIG. 1.

FIG. 5 shows the trigger bar 321 goes through the through hole 2011 of the first housing 201 and extends into the electronic device 200. The trigger bar 321 corresponds to the inductive switch 204. The trigger bar 321 connects to the inductive switch 204. When the trigger bar 321 pushes the inductive switch 204 towards or away from the inductive switch 204, the inductive switch 204 may transmit a signal to the circuit board 203, and the circuit board 203 can send out an alert signal as an antitheft measure.

Preferably, a surface of the first clamping piece 211 towards the second clamping piece 212 includes a first bump 2111. A surface of the second clamping piece 212 towards the first clamping piece 211 includes a second bump 2121, thereby a clamping force of the clamping device 20 is improved.

Figure 6:
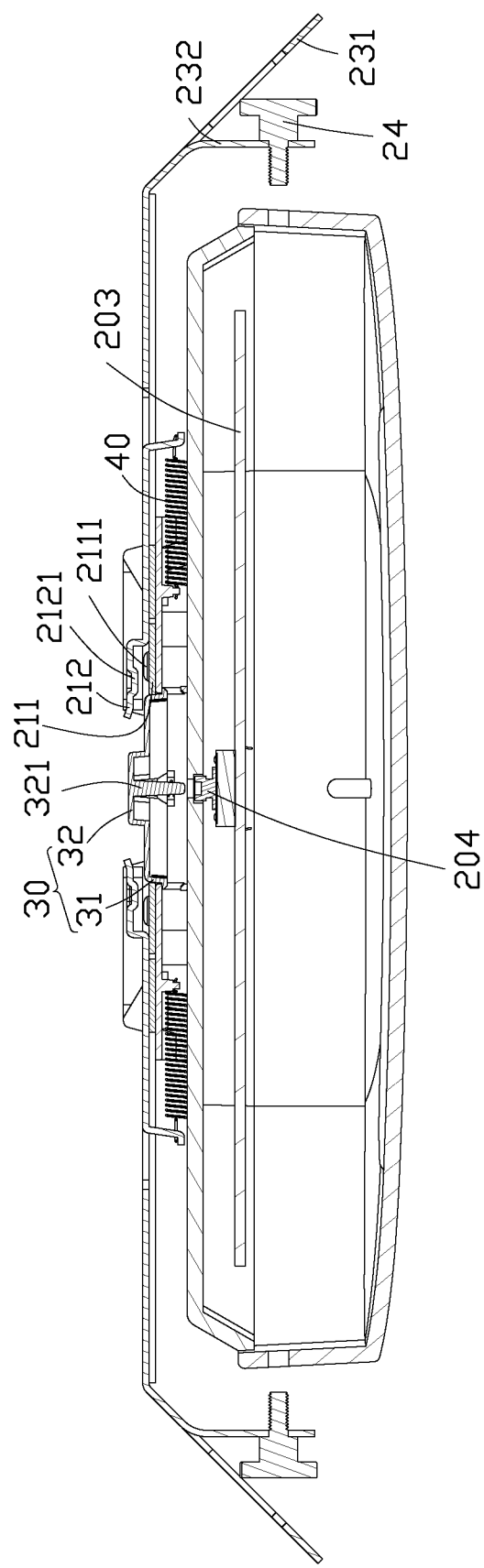
FIG. 6 is a cross-sectional view from the line V-V of FIG. 1 wherein the mounting mechanism and the electronic device are in another state.

In use, first fastening members 12 are inserted through the fixing seat 10 of the mounting mechanism 100 and the first housing 201 of the electronic device 200 to install the mounting mechanism 100 to the electronic device 200. Referring to FIG. 6, the trigger button 30 is arranged at the first position of the mounting hole 13. The trigger bar 321 of the trigger button 30 extends into the electronic device 200 arranged above the induction switch 204. The two first clamping pieces 211 of the two clamping members 20 abut against opposing ends of the first positioning portion 31 of the trigger button 30, and the two first elastic parts 40 are stretched.

Referring to FIG. 5, the mounting mechanism 100 and the electronic device 200 can move toward the fixing member 300, and the trigger button 30 can come into contact with the second fixing portion 302 of the fixing member 300. The trigger button 30 thus moves toward the electronic device 200 under pressure, until the trigger button 30 moves to the second position of the mounting hole 13. At this time, the two second elastic members 50 are compressed. The two clamping members 20 can move toward each other under the resilient force provided by the two first elastic members 40. The two clamping pieces 211 abut against opposing ends of the second positioning portion 32, and the first clamping pieces 211 and the second clamping pieces 212 cooperatively clamp the fixing member 300. In this embodiment, the clamping members 20 include the first bumps 2111 and the second bumps 2121, the second fixing portion 302 is clamped between the first bumps 2111 and the second bumps 2121. At the same time, the trigger bar 321 of the trigger button 30 contacts and pushes the inductive switch 204 of the electronic device 200, thus the circuit board 203 sends out the alert signal. The electronic device 200 is thus in a security status. Furthermore, two second fastening members 24 can be inserted through the electronic device 200 and the connecting portion 232 for ensuring that the mounting mechanism 100 is fixedly connected to the electronic device 200.

To disassemble the electronic device 200 from the fixing member 300, the two fasting screws 24 can be detached from the electronic device 200, and the two hand holding portions 231 can be pulled. The two clamping members 20 move away from each other, and the mounting mechanism 100 and electronic device 200 can thereby be detached from the fixing member 300. The trigger button 30 moves upward under the resilient force provided by the two elastic members 50, the two first clamping pieces 211 abut against the first positioning portion 31 of the trigger button 30, thus the clamping members 20 are fixed. At the same time, as the trigger button 30 is distant from the inductive switch 204, the circuit board 203 can send out another signal to warn that the electronic device 200 is detached from the fixing member 300, for the anti-thief function.

The mounting mechanism 100 may include the fixing seat 10, the trigger button 30, two clamping members 20, and two first elastic members 40. The fixing seat 10 may define the mounting hole 13, and the trigger button 30 can be movably received in the mounting hole 13. The trigger button 30 may include a first positioning portion 31 and a second positioning portion 32 protruding out of the first positioning portion 31, the two clamping members 20 may be slidably connected to two sides of the fixing base 10a, and the end of each of the clamping members 20 toward the mounting hole 13 can include a clamping part 21. Each of the first elastic members 40 may be connected between a clamping member 20 and the fixing seat 10. The two first elastic members 40 are stretched when the two clamping member 20 abut two ends of the first positioning portion 31. When the trigger button 30 moves toward the electronic device 200, the two clamping members 20 move toward each other under the resilient force provided by the two first elastic members 40, and the two clamping member 20 abut against two ends of the second positioning portion 32. The two clamping members 20 clamp two sides of the fixing member 300, thereby the electronic device 200 can be firmly and stably fixed to the fixing member 300.

The mounting mechanism 100 installs the electronic device 200 onto the fixing member 300. The installation process is simple and efficient, and the installation strength and reliability are also improved. The mounting mechanism 100 clamps the fixing member 300 through the clamping members 20, which can accommodate a variety of sizes of fixing member 300. In addition, the trigger bar 321 of the mounting mechanism 100 can trigger the trigger button 30 of the electronic device 200 to cause the circuit board 203 to send alert signals, realizing the anti-theft function.

In other embodiments, the first positioning portion 31 and the second positioning portion 32 can be rectangular or other shapes.

In other embodiments, the two second elastic members 50 can be omitted, and the trigger button 30 can moved back manually.

In other embodiments, the connecting part 232 can be omitted, and the mounting mechanism 100 can be connected to the electronic device 200 through the fixing seat 10.

It is to be understood, however, that even through numerous characteristics and advantages of the present disclosure have been set fourth in the foregoing description, together with details of assembly and function, the disclosure is illustrative only, and changes may be made in details, especially in the matters of shape, size, and arrangement of parts within the principles of the disclosure to the full extent indicated by the broad general meaning of the terms in which the appended claims are expressed.

What is claimed is:

1. A mounting mechanism equipped on an electronic device and configured for mounting to the electronic device to a fixing member, the mounting mechanism comprising:
   a fixing seat comprising:
     a fixing base defining a mounting hole, the fixing base being mountable to the electronic device by a first fastening member; and
     a plurality of projections disposed on the fixing base, the plurality of projections surrounding the mounting hole;
   a trigger button movably received in the mounting hole and comprising a first positioning portion and a second positioning portion protruding out of the first positioning portion;
   two clamping members slidably connected to two sides of the fixing base between the projections, and one end of each of the clamping members toward the trigger button comprising a clamping part, a sliding part and a holding part, wherein the sliding part is connected between the clamping part and the holding part, and the sliding part is connected to the fixing base and is adapted for sliding on the fixing base;
   a second fastening member fastening the holding part on the electronic device; and
   two first elastic members, each of the two first elastic members being connected between a corresponding one of the sliding parts and the fixing base,
   wherein when the trigger button is arranged at a first position, the trigger button is between the projections, the two clamping parts abut against opposing ends of the first positioning portion, and the two first elastic members are stretched by the sliding parts, and
   wherein when the trigger button abutting against the fixing member, the trigger button moving toward a second position from the first position by a pressing of the fixing member, the fixing member is located between the projections, the two clamping members move toward each other by a resilient force provided by the two first elastic members, and the two clamping parts clamp the fixing member, thereby the electronic device is mounted to the fixing member.

2. The mounting mechanism of claim 1, wherein the clamping part comprises a first clamping piece and a second clamping piece, the first clamping piece is slidably arranged on the fixing seat, the second clamping piece is arranged at one side of the first clamping piece away from the fixing base, and the first clamping piece and the second clamping piece are parallel and distant from each other.

3. The mounting mechanism of claim 2, wherein a length of the second clamping piece is greater than a length of the first clamping piece, and a length difference between the first clamping piece and the second clamping piece is smaller than a radius of the second positioning portion.

4. The mounting mechanism of claim 1, wherein the holding part comprises a connecting portion located away farther from the fixing base than the sliding part, and the fastening member screwed into the connecting portion and the electronic device to connect the mounting mechanism to the electronic device.

5. The mounting mechanism of claim 4, wherein the holding part further comprises a hand lifting portion arranged so as to incline to the sliding part.

6. An electronic apparatus, comprising:
a mounting mechanism comprising:
a fixing seat comprising:
a fixing base defining a mounting hole, and the fixing base being mountable to an electronic device by a first fastening member; and
a plurality of projections disposed on the fixing base, the plurality of projections surrounding the mounting hole;
a trigger button movably received in the mounting hole and comprising a first positioning portion and a second positioning portion protruding out of the first positioning portion;
two clamping members slidably connected to two sides of the fixing base between the projections, and one end of each of the clamping members toward the trigger button comprising a clamping part, a sliding part and a holding part, wherein the sliding part is connected between the clamping part and the holding part, and the sliding part is connected to the fixing base and is adapted for sliding on the fixing base;
a second fastening member fastening the holding part on the electronic device; and
two first elastic members, each of the two first elastic members being connected between a corresponding one of the sliding parts and the fixing base,
wherein when the trigger button is arranged at a first position, the trigger button is between the projections, the two clamping parts abut against opposing ends of the first positioning portion, and the two first elastic members are stretched by the sliding parts, and
wherein when the trigger button abutting against a fixing member, the trigger button moving toward a second position from the first position by a pressing of the fixing member, the fixing member is located between the projections, the two clamping members move toward each other by a resilient force provided by the two first elastic members, and the two clamping parts clamp the fixing member, thereby the electronic device is mounted to the fixing member.

7. The electronic device of claim 6, wherein the clamping part comprises a first clamping piece and a second clamping piece, the first clamping piece is slidably arranged on the fixing seat, the second clamping piece is arranged at one side of the first clamping piece away from the fixing base, and the first clamping piece and the second clamping piece are parallel and distant from each other.

8. The electronic device of claim 6, wherein the holding part comprises a connecting portion located away farther from the fixing base than the sliding part, and the second fastening member screwed into the connecting portion and the electronic device to connect the mounting mechanism to the electronic device.

* * * * *